United States Patent [19]

Allemann et al.

[11] Patent Number: 5,019,706
[45] Date of Patent: May 28, 1991

[54] ION CYCLOTRON RESONANCE SPECTROMETER

[75] Inventors: Martin Allemann, Hinwil; Pablo Caravatti, Winterthur, both of Switzerland

[73] Assignee: Spectrospin AG, Falladen, Switzerland

[21] Appl. No.: 518,120

[22] Filed: May 3, 1990

[30] Foreign Application Priority Data

May 5, 1989 [DE] Fed. Rep. of Germany ....... 3914838

[51] Int. Cl.$^5$ .............................................. H01J 49/36
[52] U.S. Cl. .................................. 250/291; 250/290; 250/282
[58] Field of Search ............... 250/291, 290, 792, 293, 250/294, 295, 281, 282

[56] References Cited

U.S. PATENT DOCUMENTS

| | | | |
|---|---|---|---|
| 3,475,605 | 10/1969 | Llewellyn | 250/291 |
| 3,502,867 | 3/1970 | Beauchamp | 250/291 |
| 3,511,986 | 5/1970 | Llewellyn | 250/291 |
| 4,818,864 | 4/1989 | Allemann | 250/291 |

*Primary Examiner*—Jack I. Berman
*Assistant Examiner*—Kiet T. Nguyen
*Attorney, Agent, or Firm*—Cohn, Powell & Hind

[57] ABSTRACT

A method of operating an ICR spectrometer comprising a measuring cell (1) having a plurality of side walls (3, 4) designed as rf electrodes and arranged symmetrically to an axis (2) extending in parallel to the field direction of a magnetic field, and further electrically insulated trapping electrodes (5, 6) arranged on both sides of the cell, viewed in the direction of the axis, which trapping electrodes can be supplied with trapping potentials of the polarity of the ions under examination in order to prevent, to a large extent, the ions from leaving the measuring cell (1) in the direction of the axis, provides that, in order to minimize the components of the electric rf field directed in parallel to the axis, which act upon the ions in the measuring cell (1), additional electric rf signals are applied to at least one said trapping electrode (5) on both sides of the said measuring cell (1). One thereby obtains in the measuring cell (1) a behavior of the electric rf field lines corresponding approximately to that which would be obtained, theoretically, in a measuring cell (1) of infinite axial length. This prevents axial acclerations of the ions in the measuring cell (1) by the electric rf field, which normally result in these ions being lost for the measuring process.

21 Claims, 3 Drawing Sheets

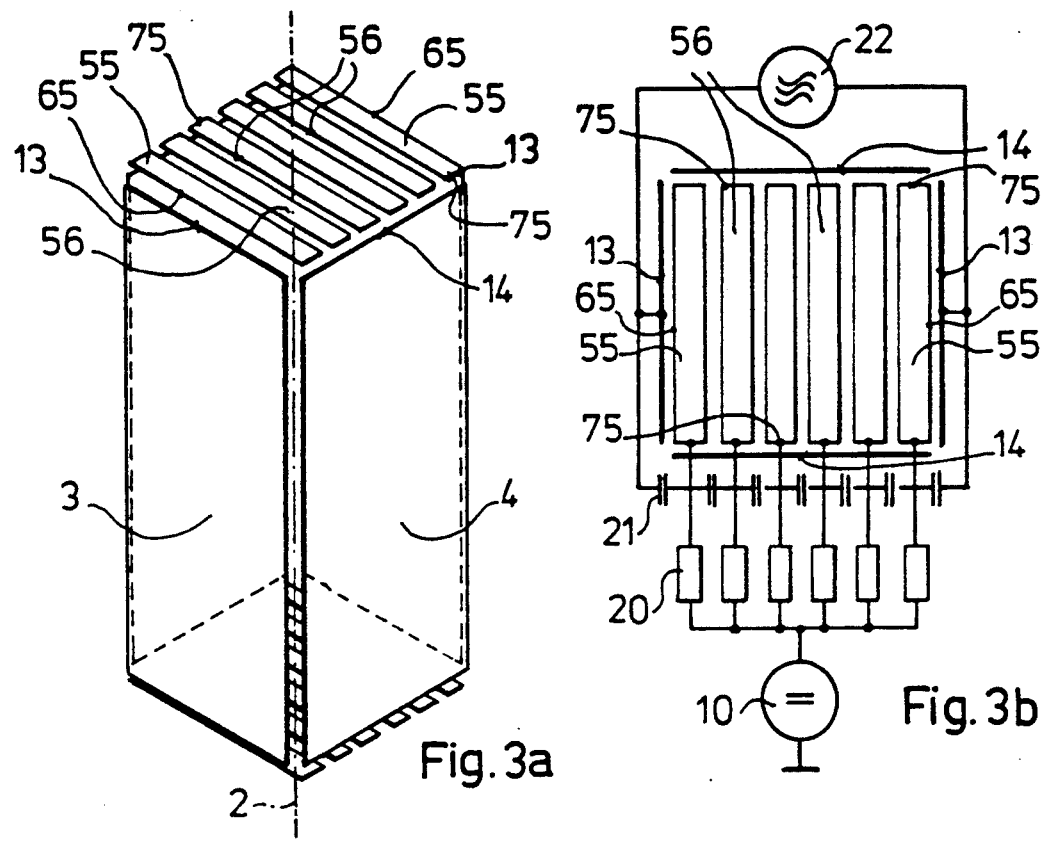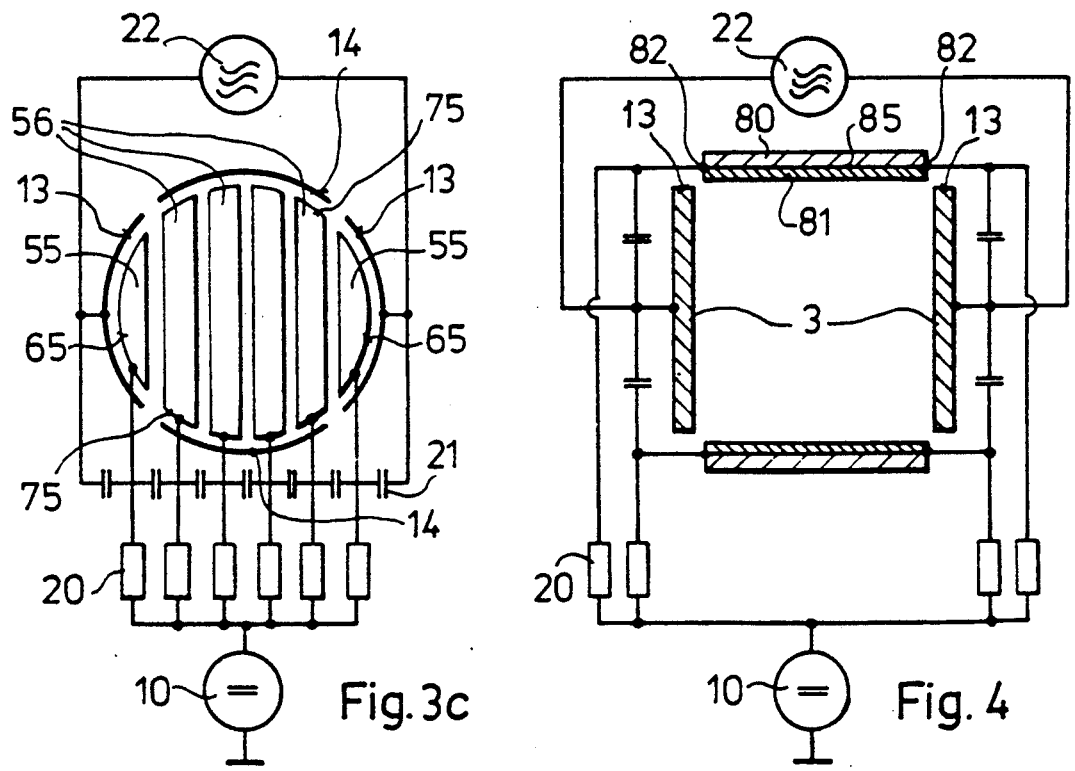

ION CYCLOTRON RESONANCE SPECTROMETER

BACKGROUND OF THE INVENTION

The present invention relates to a method of operating an ICR spectrometer comprising a measuring cell having a plurality of side walls designed as rf electrodes and arranged symmetrically to an axis extending in parallel to the field direction of a homogeneous magnetic field, and further electrically insulated trapping electrodes arranged on both sides of the cell, viewed in the direction of the axis, which trapping electrodes can be supplied with trapping potentials of the polarity of the ions under examination in order to prevent, to a large extent, the ions from leaving the measuring cell in the direction of the axis.

Such an ICR method has been described already by the paper "IonenCyclotronresonanz zur Untersuchung von Ion-Molekül-Reaktionen (the use of ion cyclotron resonance in the examination of ion molecule reactions)" by Lebert, messtechnik, 6 (1970) 109-115. It is particularly well suited for mass analysis of charged particles. For purposes of this method, the ions to be examined are either produced externally and then shot into the ICR measuring cell by means of an ion lens system, or generated in the cell by impact ionization of the residual gas particles by means of an electron beam directed into the ICR cell. The field lines of a homogeneous magnetic field B extend through the inner space of the cell in parallel to the latter's longitudinal axis. Consequently, the particles charged q times with the velocity v, are subjected to the Lorentz force $$K = qv \times B.$$

This force does not obstruct the movement of an ion parallel to the magnetic field lines. If, however, the ion of the mass m exhibits a velocity component $v_t$ perpendicular to the magnetic field, then it is forced by the Lorentz force to move along an orbit whose radius is determined by the balance between the centrifugal force and the Lorentz force:

$$r = mv_t/qB.$$

The ion moves along this orbit at the cyclotron frequency $$\omega = qB/m.$$

Consequently, any given cyclotron frequency $\omega$ is assigned to ions of the same mass so that a mass analysis of the ion shower can be performed by frequency analysis. The cyclotron resonance of the ions is produced by resonance excitation of their characteristic movement in the homogeneous magnetic field, through an electric radio frequency (rf) field applied perpendicularly to the magnetic field.

It has been a common problem heretofore of all known ICR cells having a cubic, cylindrical or hyperbolic geometry that due to the existence of finite electric rf field components in axial direction the ions do not only gain the desired energy in a direction radial to the direction of the magnetic field, during the phase of excitation by the electric rf field, but are also accelerated in axial direction. Given the fact that the potential barrier in the axial direction is as low as approx. 1eV, the ions, which have been accelerated in the axial direction, may easily escape from the cell so that they will be lost for the experiment. This problem has been known before and has been described in literature (for example by Kofel et al. in Int. J. Mass Spectrom. Ion Processes 74 (1986) 1-12).

A theoretical solution to this problem would consist in giving the cell an infinite length in the axial direction as the electric rf field would have no axial components in such a cell and would not, therefore, deflect the ions in the axial direction. However, trials with oblong cells with axial dimensions much greater than the diameter of the cell have led to unsatisfactory results, presumably because the dwelling area of the ions extended beyond the homogeneous zone of the magnetic field which is normally produced by a cryomagnet. The consequences necessarily had to be distorted lineshapes and a reduced resolving power of the spectrometer. In order not to substitute a new problem for an old one, the d.c. potentials applied to the cell should, therefore, limit the dwelling area of the ions to the homogeneous zone of the magnetic field.

SUMMARY OF THE INVENTION

Now, it is the object of the present invention to develop a method of operating an ICR spectrometer which is capable of reducing significantly the phenomenon of ions escaping from the measuring cell in the axial direction.

As regards the method, the invention achieves this object by the fact that in order to minimize the components of the electric rf field directed in parallel to the axis, which act upon the ions in the measuring cell, additional electric rf signals are applied to at least one trapping electrode on both sides of the measuring cell.

This method enables the electric rf field acting on the ions in the measuring cell to be shaped in the same manner as if it had been irradiated by rf electrodes of infinite axial length. This is due to the fact that the marginal inhomogeneities produced at the ends of the cell by the finite length of the measuring cell in the axial direction are balanced out by their heterodyning with the additional electric rf field components which are introduced by the trapping electrodes, it being not necessary for this purpose to change the basic shape of the measuring cell in a notable manner.

In order to establish a firm phase relationship between the side walls of the cell, which act as rf transmitter electrodes, and the rf signal applied to the trapping electrodes which are the closest to such side walls, one embodiment of the method according to the invention provides that the value of the frequency of the rf signal is an integral multiple of the rf value encountered at the respective side wall.

According to another embodiment of the method according to the invention, the rf arrangements of the ICR spectrometer can be realized in a particularly simple manner if the rf signals applied to the trapping electrode are identical to those applied to the side walls. There is then no need for additional frequency and/or voltage divider means which otherwise would have to be provided between the rf generators for the rf pulses applied to the side walls, and the trapping electrodes. However, it is then necessary to adapt the geometry of the trapping electrodes to the shape of the corresponding side walls to which the rf pulses are applied in such a manner that the axial component is minimized in the heterodyning rf fields.

If, on the other hand, the trapping electrodes have a given, maybe less favorable shape which cannot be changed for experimental or other reasons, then another embodiment of the method according to the invention provides that the axial components of the rf field acting upon the ions in the measuring cell can be minimized by varying the voltage amplitudes of the rf pulses applied to the trapping electrodes.

The method according to the invention is suitable for use in both ICR spectrometers with external ion generation and in ICR spectrometers where the ions are generated within the measuring cell (for example by impact ionization). Similarly, the method according to the invention can be used with great advantage for minimizing the axial component of the rf field in drift cells because it is largely possible in this way to avoid disturbing influences of the rf field on the reaction dynamics of the particles under examination, in a direction parallel to the drift axis, which normally coincides with the axis of the measuring cell. The same applies to the application of the method according to the invention in double or multiple resonance appliances, as known from U.S. Pat. No. 3,511,986 or from the before-mentioned paper by K. H. Lebert, and to the use in Fourier (transform) mass spectrometry (FTMS), as described, for example, by Cody et al., Anal. Chem., 54 (1982) 2225-2228, or by Settine et al., European Spectroscopy News, 58 (1985) 16-18.

As regards the device, the object underlying the present invention is achieved by an ICR spectrometer with a measuring cell having any axially symmetrical shape and using trapping electrodes which are realized in such a way that the axial electric rf field components in the measuring cell are minimized by applying the electric rf pulses to the trapping electrodes. The measuring cell may, for example, have the form of a cylinder, a cube or a cuboid. Depending on the particular requirements of the experiment, the measuring cell of the ICR spectrometer according to the invention may, however, also have the shape of a ball, of a double cone or of a Penning cage with wall surfaces in the form of a hyperboloid of revolution.

According to one particular embodiment of the invention, the side walls of the measuring cell are formed by four azimuthal nappe sections of a circular cylinder, which are electrically insulated from each other and where each pair of oppositely arranged side walls may be used as rf transmitter electrodes and rf receiver electrodes, respectively.

According to a further improvement of the ICR spectrometer of the invention, each of the ends of the circular cylindrical measuring cell is closed by a circular disk composed of three trapping electrodes and having a diameter equal to that of the circular cylinder formed by the side walls, the arrangement being such that the outer edges of the inner trapping electrodes face the edges of the side walls which do not have an rf connection, while the outer edges of the two outer trapping electrodes face the edges of the side walls having an rf connection, and that the outer trapping electrodes can be supplied with an rf signal in addition to the trapping potential which is applied also to the inner trapping electrodes.

A particularly favorable behavior of the rf field lines, as regards the minimization of the axial components in the rf field in the measuring cell, is achieved by a further improvement according to which the inner and the outer edges of the outer trapping electrodes, to which an rf signal is applied, are arcs of a circle of identical arc lengths. A still further improvement is achieved when the contours of the inner edges of the trapping electrodes follow the actual development of rf equipotential lines, in particular the lines for $+U/2$ and $-U/2$, which mark the locus of half the maximum amount of the electric rf field irradiated from the side walls.

According to another embodiment of the ICR spectrometer, each of the ends of the cylinder formed by the side walls is followed, in the axial direction, by another cylinder having the same cross-section as the first cylinder, the azimuthal nappe sections of each of such other cylinders being formed by two pairs of oppositely arranged trapping electrodes whose edges lie adjacent the edges of the side walls and have substantially the same length as the latter, and the pair of trapping electrodes which is arranged opposite the rf-impressed side walls of the measuring cell, viewed in axial direction, can be impressed by an rf signal in addition to the trapping potential which is applied also to the other pair of trapping electrodes.

This arrangement has the result that the electric rf field is not broken off abruptly at the edges of the measuring cell, as in the case of the conventional termination of the cell using flat trapping electrodes to which no rf signals are applied, which then gives rise to undesirable field distortions and to the detrimental axial components of the rf field lines; instead, the rf field obtained in the cell is as homogeneous as the one that would be encountered, theoretically, in a cell of infinite axial extension, and is composed exclusively of radial field components.

According to a preferred embodiment of the invention, the three cylinders formed by the side walls of the measuring cell and the trapping electrodes are identical to each other, a feature which simplifies significantly the production and handling of the device.

According to another embodiment of the ICR spectrometer according to the invention, the trapping electrodes consist of a plurality of parallel strips forming together two disks closing the measuring cell on both sides. In order to enable the rf field behavior in the measuring cell to be influenced in a finely tuned manner with a view to minimizing the inhomogeneities and, thus, the detrimental axial components of the rf field lines, the trapping electrodes are coupled capacitively to the rf voltage source in such a way that the rf voltage applied to the trapping electrodes can be transferred by steps from the one polarity which is connected to that side wall of the trapping electrode which is arranged adjacent the corresponding outer trapping electrode and which acts as rf transmitter electrode, to the opposite polarity on the other side of the cell.

In the most favorable of all cases of the last-described embodiment of the invention, the contours of the edges of the strips forming the trapping electrodes, instead of being parallel, follow the actual shape of the rf equipotential lines.

If one imagines the trapping electrodes to be subdivided into an ever greater number of ever smaller strips, which would of course lead to an ever finer graduation of the rf adaptation potentials at the individual trapping electrodes, it is clear that one would finally arrive at a continuous transition from the one rf polarity to the opposite rf polarity. This idea is implemented in practice, according to another embodiment of the invention, by the use of high-ohmic trapping electrodes which have both sides coupled capacitively to the respective neighboring side wall of the cell serving as rf transmitter electrode. Typical values of the electric resistance between the two sides of the trapping electrodes are in the range of between 1 and 100 kΩ although, according to certain special embodiments of the invention, the trapping electrodes may also serve as terminating resistors for the rf transmitter and may in this case have a resistance in the range of 50 Ω.

According to one embodiment of the invention, the high-ohmic trapping electrodes consist of a high-ohmic conductive coating applied on that face of a non-conductive substrate which faces the interior of the measuring cell. In particular, the substrate may consist of a ceramic material, such as $TiO_2$, and the conductive layer may consist of a metal, such as Ag or Au, deposited thereon by evaporation.

A preferred embodiment of the ICR spectrometer according to the invention provides that the trapping electrodes consist of a polymeric halogenated polyolefine, in particular a polytetrafluor ethylene (PTFE), such as Teflon, and contain a high proportion of carbon, in particular between 10 and 30 percent by weight. Such trapping electrodes can be produced particularly easily and at low cost.

According to another embodiment of the invention, the trapping electrodes contain semiconductor materials, such as Si, Ge or GaAs.

The invention will be described and explained hereafter in more detail with reference to the embodiments illustrated in the drawing. The features that can be derived from the following specification and the drawing may be used in other embodiments of the invention each individually or in any combination thereof.

BRIEF DESCRIPTION OF THE DRAWINGS

FIG. 3a shows a three-dimensional representation of an ICR cell according to the invention, with strip-shaped trapping electrodes;

FIG. 3b shows a top view of the ICR cell illustrated in FIG. 3a, viewed in axial direction, with its electrical wiring;

FIG. 3c shows a top view, viewed in axial direction, of an ICR cell according to the invention, having the geometry of a circular cylinder and strip-shaped trapping electrodes, and with its electric wiring represented diagrammatically;

FIG. 4 shows a diagrammatic longitudinal section through an ICR cell according to the invention with trapping electrodes with a high-ohmic coating, and with its electric wiring represented diagrammatically;

DESCRIPTION OF THE PREFERRED EMBODIMENTS

Figure 1A:
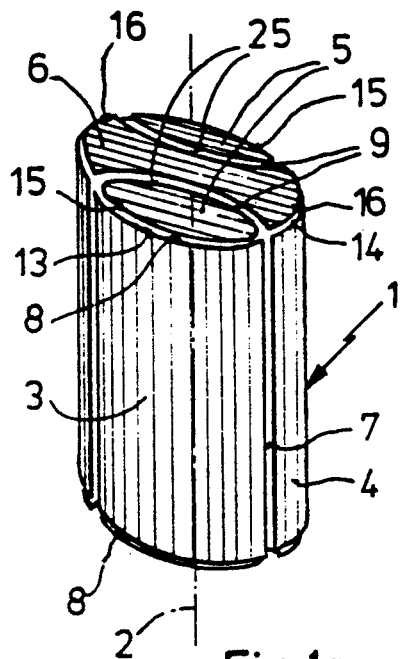
FIG. 1a shows a three-dimensional representation of an ICR cell according to the invention.

The measuring cell 1 of an ion cyclotron resonance spectrometer illustrated in FIG. 1a comprises two pairs of oppositely arranged side walls 3 and 4, designed as rf electrodes, and electrically insulated trapping electrodes 5 and 6 arranged on both sides of the cell, viewed along the central axis 2. The side walls 3, 4 are separated from each other by gaps 7, and from the trapping electrodes 5, 6 by gaps 8. The outer trapping electrodes 5 are separated from the inner trapping electrodes 6 by gaps 9. The edges 15 of the outer trapping electrodes 5 are arranged adjacent the edges 13 of the side walls 3, while the edges 16 of the inner trapping electrodes 6 are arranged adjacent the edges 14 of the side walls 4.

Figure 1B:
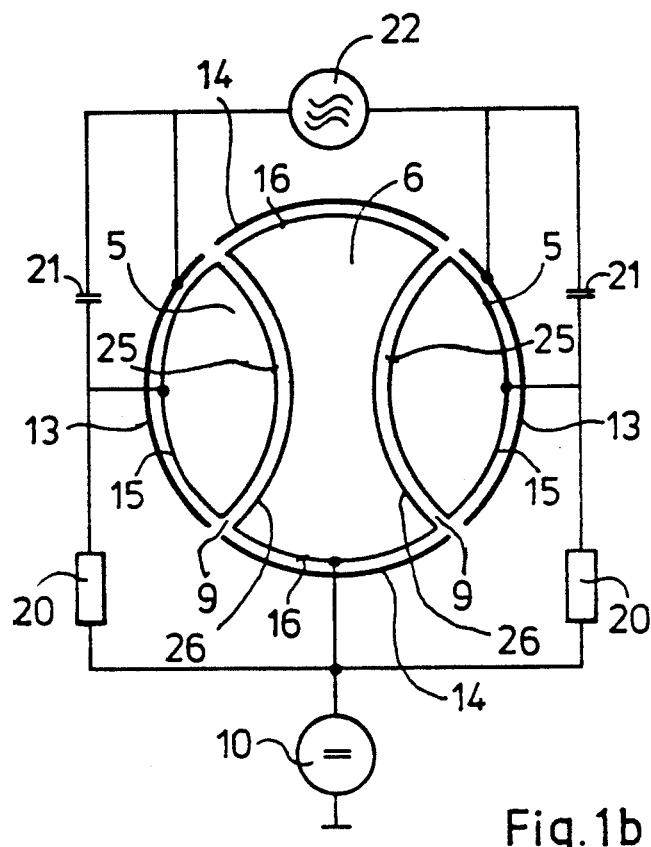
FIG. 1b shows a top view of the ICR cell illustrated in FIG. 1a, viewed in axial direction, with its electric wiring represented diagrammatically.

FIG. 1b illustrates the electric wiring of the measuring cell 1: Each of the opposite side walls 3 is connected to one of the two poles of an rf generator 22, thus acting as transmitter electrodes. The electric wiring of the side walls 4, which act as receiver electrodes, is not illustrated in the drawing. Capacitors 21 connect the outer trapping electrodes 5 to the same pole of the rf generator 22 to which the side wall 3 next to them is connected. In addition, the outer trapping electrodes 5 are directly supplied with d.c. voltage from the d.c. source 10, via resistors 20 and the inner trapping electrodes 6.

In operation, the ICR cell usually is located in a high or ultrahigh vacuum. Each measuring cycle commences by the step of applying to the trapping electrodes 5, 6 an electric potential opposite to that of the ions under examination, whereby all ions present in the cell are drawn off. Thereafter, the ions to be examined are either shot into the cell from the outside, for example through suitable bores extending along the axis 2, using an ion lens system not illustrated in the drawing, or generated within the measuring cell, for example by electron impact ionization of residual gas particles. A homogeneous magnetic field B, whose field lines are directed parallel to the axis 2, exerts a Lorentz force upon all ions having velocity components perpendicular to the axis 2, thereby forcing the ions to move along orbits perpendicular to the magnetic field lines. By irradiating a suitable electric radio frequency (rf) signal via the side walls 3, it is now possible to deflect the ions to be examined in a direction perpendicular to the magnetic field lines and to induce them to move about the magnetic field lines in a manner characteristic of their mass, which movement is also described as cyclotron resonance. The ions having been coherently excited in this manner and revolving in the cell, now generate rf signals on the side walls 4, by induced charges, which signals can be tapped, amplified and analyzed by suitable measuring arrangements.

The movement of the ions parallel to the axis 2 is not obstructed by the homogeneous magnetic field. In order to prevent any ions having velocity components parallel to the axis 2 from escaping from the cell in an axial direction, an electrostatic trapping potential of the polarity of the ions to be examined is applied to the trapping electrodes 5, 6 from the d.c. source 10. The value of the potential barrier in the axial direction may, however, not be much higher than 1 eV as otherwise the electrostatic field extending into the measuring area, in particular its component directed transversely to the axis 2, would have an excessive disturbing influence on the ion movements.

While the electric rf field irradiated from the side walls 3 has only insignificantly low components in the direction of the axis 2, in the central areas of the measuring cell 1, the axial rf field components increase heavily, due to field line distortions, in the proximity of the trapping electrodes, whereby any ions entering these regions are accelerated, also in axial direction. Many of these axially accelerated ions break the potential barrier of the electrostatic field, drop upon the trapping plates and are lost for the measuring process.

By irradiating the electric rf field through the trapping electrodes 5 it is possibly to diminish substantially the marginal inhomogeneities of the electric rf field irradiated from the side walls 3, to minimize the axial components of the electric rf field acting upon the ions present within the measuring cell 1, and to reduce in this manner significantly the losses due to ions escaping from the cell in axial directions. It is necessary to this end that the value of the frequency of the rf signal irradiated additionally by the trapping electrodes 5 be equal to an integral multiple of the frequency of the rf signal applied to the side walls 3 next to each of the trapping electrodes 5. This means, in particular, that the frequencies may also be identical. In addition, it is also possible to minimize the axial components of the whole electric rf field present in the measuring cell 1 by corresponding adjustment of the amplitudes of the rf pulses irradiated from the trapping electrodes 5. The particular form of the trapping electrodes 5, 6 illustrated in FIGS. 1a and 1b, where the outer edges 15 and the inner edges 25 are arcs of a circle of equal arc lengths, with the arc lengths coinciding substantially with the length of the edges 13, enables the axial rf field components to be minimized already by applying, to the trapping electrodes 5, rf signals having the same frequency and the same amplitude as the rf signals applied to the side walls 3. Consequently, there is no need in this case for additional frequency and/or voltage divider means.

Figure 5A:
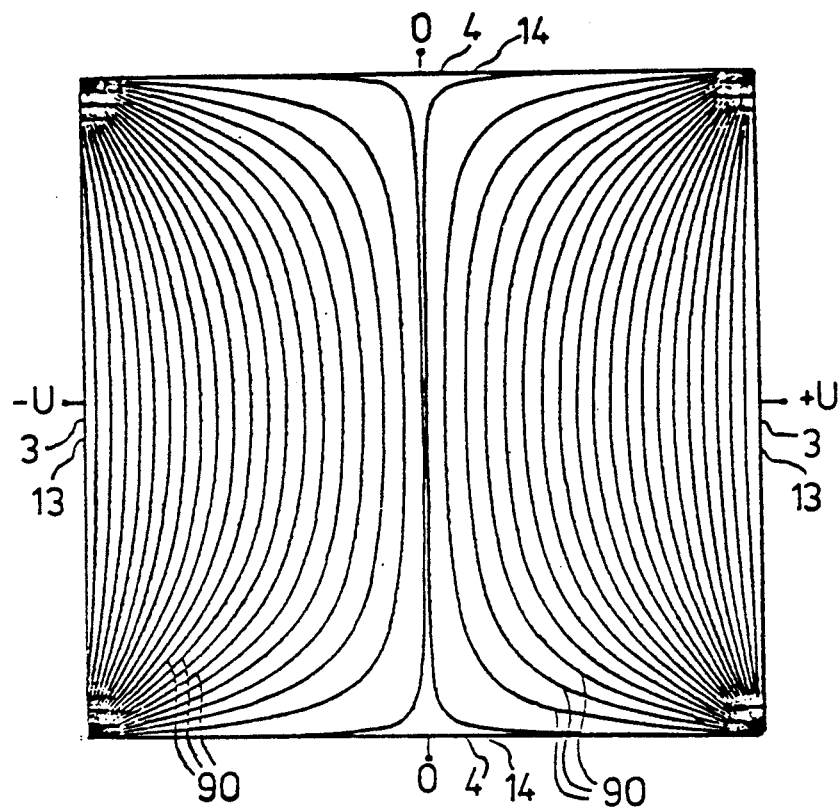
FIG. 5a shows the shape of the equipotential lines of the electric rf field of an ICR cell of square cross-section, in a plane perpendicular to the axis of the cell, with neighboring equipotential lines differing by 5% of the value (U) of the rf voltage applied to the side walls.
Figure 5B:
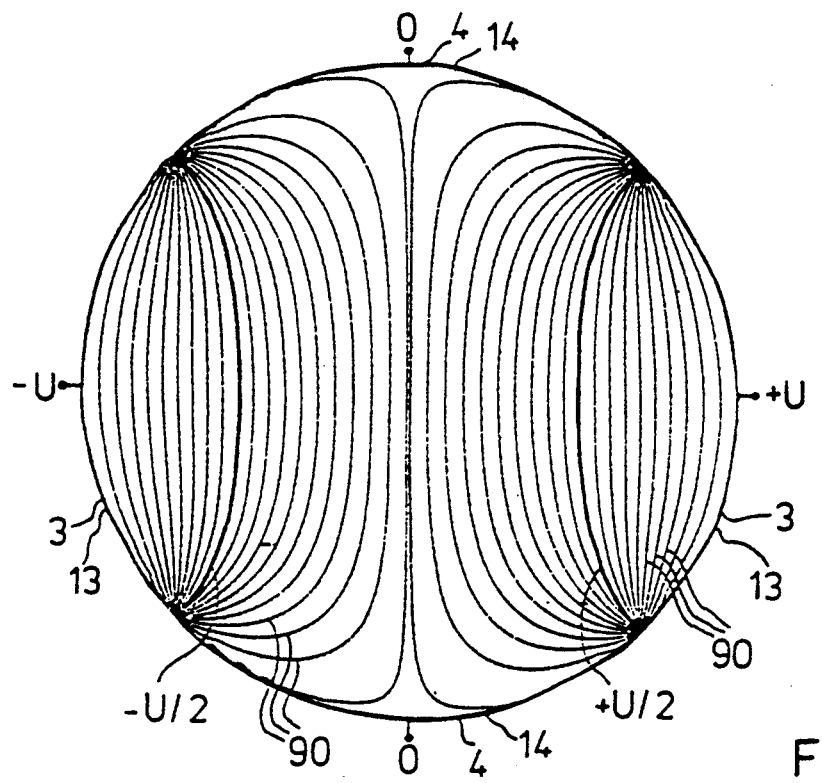
FIG. 5b shows the shape of the equipotential lines of an ICR cell of symmetrical cylindrical cross-section, in a plane perpendicular to the axis of the cell.

A further improvement is achieved when the contours of the inner edges 25 of the outer trapping electrodes 5 and the contours of the inner edges 26 of the inner trapping electrode 6 follow the measured or calculated shape of one of the rf equipotential lines as illustrated in FIG. 5b. The lines selected for this purpose may, for example, be those for $+U/2$ and $-U/2$, which have been specially highlighted in FIG. 5b which shows an example of an rf field with the voltage amplitudes $\pm U$ irradiated from the side walls 3.

Figure 2:
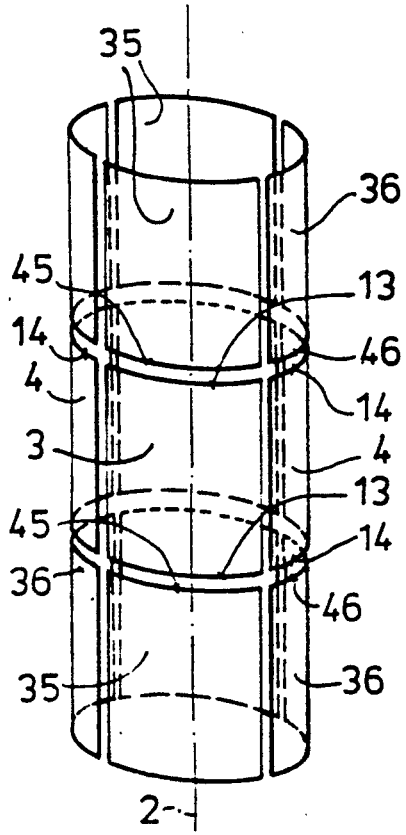
FIG. 2 shows a three-dimensional representation of one embodiment of an ICR cell according to the invention, with cylindrical trapping electrodes.

FIG. 2 shows a measuring cell 1 composed of three cylinders having a common axis 2. The central cylinder consists of two pairs of oppositely arranged side walls 3 and 4 defining the measuring volume proper. The side walls 3 act again as rf transmitter electrodes, while the side walls 4 serve as rf receiver electrodes. The two cylinders arranged adjacent the two ends of that central cylinder are constituted by pairs of oppositely arranged trapping electrodes 35 and 36, respectively. The edges 45 of the electrodes 35, to which corresponding rf pulses can be applied in addition to the applied trapping potentials, extend opposite the edges 13 of the side walls 3, while the edges 46 of the trapping electrodes 36, which can be supplied only with the trapping potential, extend opposite the edges 14 of the side walls 4. If in the case of this arrangement the rf pulses applied to the trapping electrodes 35 are exactly the same as those applied to the side walls 3, this will have the effect to eliminate completely any marginal inhomogeneities of the electric rf field in the central cylinder. The rf field distribution in the area of the edges 13, 14 is similar to that which would prevail in a cell of infinite length in the axial direction. Particular production advantages can be achieved in the case of this embodiment of an ICR cell if all the three cylinders are identical in size and made from the same material. The three electrodes 3, 4, 35 and 36 would then be exchangeable in principle.

The measuring cell 1 illustrated in FIG. 3a has the shape of an elongated cuboid with square base and top surfaces, the latter consisting each of a flat arrangement of strip-like trapping electrodes 55 and 56, respectively. The longitudinal edges 65 of the outer trapping electrodes 55 extend opposite the respective edges 13 of the rf-impressed side walls 3, while the transverse edges 75 of the outer trapping electrodes 55, and of the inner trapping electrodes 56 as well, are arranged opposite the respective edges 14 of the side walls 4 serving as receiver electrodes. The electric wiring of the measuring cell 1 of FIG. 3a is shown in detail in FIG. 3b. The inner trapping electrodes 56 are connected to their respective neighbors by capacitors 21, while the two outer trapping electrodes 55 are coupled capacitively to the respective neighboring rf-impressed side wall 3. This arrangement has the result that the rf voltage applied to the trapping electrodes is transferred by steps from the one polarity of the rf generator 22 to the other polarity. It is possible in this way to influence the rf field behavior in the measuring cell in a finely tuned manner with a view to minimizing the inhomogeneities in the marginal areas, in particular the detrimental axial components of the rf field lines. FIG. 3c, which corresponds to FIG. 3b, shows an analogous arrangement, but in the form of a symmetrical cylinder. The measuring cell 1 may, however, also be given the shape of a prismatic body or may, quite generally, have any axially symmetrical design.

The most favorable design, theoretically, would be one where the contours of the edges of the strips forming the trapping electrodes 55, 56 do not extend in parallel, but follow the actual shape of the rf equipotential lines. This latter is illustrated in FIG. 5a for an ICR cell of square cross section, in FIG. 5b for a cell having the cross-section of a symmetrical cylinder. Neighboring equipotential lines 90 differ in potential from the amount U by 5% of the rf voltage amplitudes applied to the side walls 3. In FIG. 5b, the two equipotential lines where the potential is equal to half the value of the voltage amplitudes prevailing on the walls, have been specially highlighted.

If one imagines the trapping electrodes to be subdivided into an ever greater number of ever smaller strips, which would of course lead to an ever finer graduation of the rf adaptation potentials at the individual trapping electrodes, one would finally arrive at a continuous transition from the one rf polarity to the opposite rf polarity. This idea has been implemented in the embodiment illustrated in FIG. 4. The ICR cell of this embodiment can do with only two trapping electrodes 85 arranged at the ends of the measuring cell 1. The edges 82, by which the trapping electrodes 85 are coupled capacitively to the respective pole of the rf generator 22, extend immediately adjacent the edges 13 of the rf-impressed side walls 3. The trapping electrodes 85 in FIG. 4 consist of a high-ohmic conductive layer 81 which has been deposited on a substrate 80 by evaporation and whose resistance between two opposite edges 82 is, typically, between 1 and 100 kΩ, though in certain special variants of this embodiment the trapping electrodes 85 may also serve as terminating resistors for the rf transmitter and have a resistance value in the range of 50 Ω. The substrate may, in particular, consist of a ceramic material, such as $TiO_2$, and the conductive layer may consist of a metal, such as Ag or Au, deposited thereon by evaporation. On the other hand, the trapping electrodes 85 may also consist of a polymeric halogenated polyolefine, including in particular a polytetrafluor ethylene (PTFE), such as Teflon, containing a high proportion of carbon in the range of between 10 and 30 percent by weight. The trapping electrodes 85 can then be produced in a particularly simple and low-cost manner. Another possibility consists in the use of semiconductor materials, such as Si, Ge or GaAs, for the production of the trapping electrodes 85.

The reference numerals in the claims are no restriction but meant to facilitate the understanding of the claims.

We claim:

1. A method of operating an ICR spectrometer comprising a measuring cell (1) having a plurality of side walls (3, 4) designed as rf electrodes and arranged symmetrically to an axis (2) extending in parallel to the field direction of a homogeneous magnetic field, and further electrically insulated trapping electrodes (5, 6, 35, 36, 55, 56, 85) arranged on both sides of the cell, viewed in the direction of the axis, which trapping electrodes are supplied with trapping potentials of the polarity of the ions under examination in order to prevent, to a large extent, the ions from leaving the measuring cell (1) in the direction of the axis,
wherein in order to minimize the components of the electric rf field directed in parallel to the axis, which act upon the ions in the measuring cell (1), additional electric rf signals are applied to at least one of said trapping electrodes (5, 35, 55, 56, 85) on both sides of the said measuring cell (1).

2. A method according to claim 1, wherein the value of the frequency of the rf signal applied to the said trapping electrodes (5, 35, 55, 56, 85) is an integral multiple of or identical to the frequency of the rf signal applied to the side walls (3) next to the respective trapping electrode (5, 35, 55, 56, 85).

3. A method according to claim 1, wherein the amplitudes of the rf pulses applied to the said trapping electrodes (5, 35, 55, 56, 85) are adjusted independently of the amplitudes of the rf pulses applied to the said side walls (3).

4. A method according to claim 1, wherein the measuring cell (1) is operated as a drift chamber.

5. A method according to claim 1, wherein the said spectrometer is operated as a double or multiple resonance arrangement.

6. A method according to claim 1, wherein the said spectrometer is operated as a Fourier mass spectrometer.

7. An ICR spectrometer for operation by the method according to claim 1, wherein the said measuring cell (1) has the shape of a cylinder, in particular of a circular cylinder, a cuboid or a cube.

8. An ICR spectrometer according to claim 7, wherein the said side walls (3, 4) of the said measuring cell (1) are formed by four nappe sections of a circular cylinder, which are electrically insulated from each other and where the oppositely arranged side walls (3) are used as rf transmitter electrodes and the oppositely arranged side walls (4) are used as rf receiver electrodes.

9. An ICR spectrometer according to claim 8, wherein each of the ends of the said measuring cell (1) is closed by a circular disk composed of three trapping electrodes (5, 6) and having a diameter equal to that of the circular cylinder formed by the said side walls (3, 4), the arrangement being such that the outer edges (16) of the inner trapping electrodes (6) face the edges (14) of the side walls (4) which do not have an rf connection, while the outer edges (15) of the two outer trapping electrodes (5) face the edges (13) of the side walls (3) having an rf connection, and that the outer trapping electrodes (5) are supplied with an rf signal in addition to the trapping potential which is applied also to the inner trapping electrodes (6).

10. An ICR spectrometer according to claim 9, wherein the said inner (25) and the said outer edges (15) of the said outer trapping electrodes (5) are arcs of a circle of identical arc lengths.

11. An ICR spectrometer according to claim 9, wherein the said outer edges (15) of the said outer trapping electrodes (5) and the said outer edges (16) of the said inner trapping electrode (6) are arcs of a circle of identical arc lengths, while the contours of the inner edges (25) of the said outer trapping electrodes (5) and the inner edges (26) of the said inner trapping electrode (6) are approximated to the computed shape of an rf equipotential line, in particular the respective equipotential line of half the positive and half the negative amplitude of the rf field applied to the said transmitter electrodes.

12. An ICR spectrometer according to claim 7, wherein each of the ends of the cylinder formed by the said side walls (3, 4) is followed, in the axial direction, by another cylinder having the same cross-section as the said first cylinder, the azimuthal nappe section of each of such other cylinders being formed by two pairs of oppositely arranged trapping electrodes (35 or 36) whose edges (45, 46) lie adjacent the edges (13, 14) of the said side walls (3, 4) and have substantially the same length as the latter, and the pair (35) of trapping electrodes which is arranged opposite the rf-supplied side walls (3) of the said measuring cell (1), viewed in axial direction, can be supplied with an rf signal in addition to the trapping potential which is applied also to the other pair (36) of trapping electrodes.

13. An ICR spectrometer according to claim 7, wherein the said measuring cell (1) is closed on each side by a disk whose circumferential contour defines a cross-section corresponding to the cross-section of the measuring cell (1) defined by the side walls (3, 4) perpendicular to the axis (2), the said disk consisting of a plurality of parallel strip-like trapping electrodes (55, 56), with one of the longitudinal edges (65) of each said outer trapping electrode (55) being arranged adjacent one side wall (3) of the said measuring cell (1), while the transverse edges (75) are arranged adjacent the edges (14) of the said side walls (4).

14. An ICR spectrometer according to claim 13, wherein the contours of the edges of the said strips forming the said trapping electrodes (55, 56), instead of being parallel, follow the actual shape of the equipotential lines (90) of the rf field which is irradiated from said the side walls (3).

15. An ICR spectrometer according to claim 13, wherein the said inner trapping electrodes (56) are coupled capacitively to their respective neighbors, while each of the said two outer trapping electrodes (55) is coupled capacitively to its neighboring inner trapping electrode (56) and, on the other hand, to the pole of the rf voltage source (22) opposite the other outer trapping electrode (55), all said trapping electrodes (55, 56) being coupled resistively to a d.c. source (10) generating a trapping potential.

16. An ICR spectrometer according to claim 7, wherein the said measuring cell (1) is closed on each end by a trapping electrode (85) whose circumferential contours (82) define a cross-section corresponding to the cross-section of the measuring cell (1) defined by the edges (13, 14) of the said side walls (3, 4), each of the said trapping electrodes (85) having its edge (82) neighboring the edge (13) of an rf-supplied side wall (3) coupled on the one hand capacitively to the rf potential applied to the respective side wall (3) and, on the other hand, resistively to the trapping potential of a d.c. source (10), the resistance of a trapping electrode (85) between two opposite edges (82) being in the range of between 1 and 100 k$\Omega$.

17. An ICR spectrometer according to claim 16, wherein the said two trapping electrodes (85) serve as terminating resistors for the said rf transmitter and have a resistance of 50 $\Omega$ each.

18. An ICR spectrometer according to claim 16, wherein the said trapping electrodes (85) comprise a high-ohmic coating (81) applied on that face of a nonconductive substrate (80) which faces the interior of the said measuring cell (1).

19. An ICR spectrometer according to claim 18, wherein the said substrate (80) consists of a ceramic material, such as $TiO_2$, and the said high-ohmic coating (81) consists of a thin conductive coating, such as Ag or Au, deposited thereon by evaporation.

20. An ICR spectrometer according to claim 16, wherein the said trapping electrodes (85) consist of a polymeric halogenated polyolefine, in particular a polytetrafluor ethylene (PTFE), such as Teflon, and contain a high proportion of carbon, in particular between 10 and 30 percent by weight.

21. An ICR spectrometer according to claim 16, wherein the said trapping electrodes (85) contain semiconductor materials, such as Si, Ge or GaAs.

* * * * *